(12) United States Patent
Zhou et al.

(10) Patent No.: US 10,525,841 B2
(45) Date of Patent: Jan. 7, 2020

(54) GATE DRIVER WITH SHORT CIRCUIT PROTECTION

(71) Applicant: Ford Global Technologies, LLC, Dearborn, MI (US)

(72) Inventors: Yan Zhou, Canton, MI (US); Shuitao Yang, Dearborn Heights, MI (US); Lihua Chen, Farmington Hills, MI (US); Fan Xu, Novi, MI (US); Mohammed Khorshed Alam, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 113 days.

(21) Appl. No.: 15/291,312

(22) Filed: Oct. 12, 2016

(65) Prior Publication Data

US 2018/0099574 A1   Apr. 12, 2018

(51) Int. Cl.
| | | |
|---|---|---|
| *B60L 11/18* | (2006.01) | |
| *H03K 17/04* | (2006.01) | |
| *H02M 7/537* | (2006.01) | |
| *B60L 53/14* | (2019.01) | |
| *H02M 1/32* | (2007.01) | |
| *H02M 3/158* | (2006.01) | |
| *H02M 7/5387* | (2007.01) | |
| *H03K 17/16* | (2006.01) | |
| *B60L 3/00* | (2019.01) | |
| *H02M 1/00* | (2006.01) | |

(52) U.S. Cl.
CPC ............ *B60L 53/14* (2019.02); *B60L 3/0038* (2013.01); *H02M 1/32* (2013.01); *H02M 3/158* (2013.01); *H02M 7/537* (2013.01); *H02M 7/5387* (2013.01); *H03K 17/0406* (2013.01); *H03K 17/168* (2013.01); *B60L 2210/40* (2013.01); *B60L 2240/80* (2013.01); *H02M 2001/007* (2013.01)

(58) Field of Classification Search
CPC ........ B60R 16/03; B60L 53/14; B60L 3/0038; B60L 2240/80; B60L 2210/40; H03K 17/168; H03K 17/0406; H02M 7/5387; H02M 3/158; H02M 1/32; H02M 7/537; H02M 2001/007
See application file for complete search history.

(56) References Cited

U.S. PATENT DOCUMENTS 5,355,298 A   10/1994  Seki
6,104,149 A    8/2000  Pelly
(Continued)

*Primary Examiner* — Rexford N Barnie
*Assistant Examiner* — Terrence R Willoughby
(74) *Attorney, Agent, or Firm* — David B. Kelley; Brooks Kushman P.C.

(57) ABSTRACT

A vehicle includes an electric machine configured to provide propulsive force to the vehicle, and a power inverter configured to supply power from a traction battery to the electric machine using a first and second switch configured as a half-bridge, wherein the first switch is controlled by a gate driver. The gate driver is configured to operate in a soft turn-off mode when a load current exceeds a threshold for a time period defined by a mask timer, operate in a fast turn-off mode when the load current is below the threshold, and in response to a turn-off request received prior to expiration of the mask timer after the load current exceeds the threshold, enable the soft turn-off mode.

14 Claims, 7 Drawing Sheets

(56) References Cited

U.S. PATENT DOCUMENTS

| | | |
|---|---|---|
| 6,396,721 B1 | 5/2002 | Sonoda et al. |
| 9,209,618 B2 | 12/2015 | Mari Curbelo et al. |
| 2015/0280416 A1* | 10/2015 | Kreuter ................. H01H 83/00 361/55 |

* cited by examiner

GATE DRIVER WITH SHORT CIRCUIT PROTECTION

TECHNICAL FIELD

This application is generally related to a gate driver for a solid state switch in which feedback from the switch is used to detect and provide short circuit protection of the switch.

BACKGROUND

Electrified vehicles including hybrid-electric vehicles (HEVs) and battery electric vehicles (BEVs) rely on a traction battery to provide power to a traction motor for propulsion and a power inverter therebetween to convert direct current (DC) power to alternating current (AC) power. The typical AC traction motor is a 3-phase motor that may be powered by 3 sinusoidal signals each driven with 120 degrees phase separation. The traction battery is configured to operate in a particular voltage range and provide a maximum current. The traction battery is alternatively referred to as a high-voltage battery wherein a terminal voltage of a typical traction battery is over 100 Volts DC. However, improved performance of electric machines may be achieved by operating in a different voltage range, typically at voltages greater than the traction battery terminal voltage. Likewise, the current requirements to drive a vehicular electric machine are commonly referred to as high current. The impact of the high current and voltage on the inductance of the electric machine may result in voltage spikes across the switch when the switch is open and energy is stored in the field of the electric machine inductor.

Also, many electrified vehicles include a DC-DC converter, also referred to as a variable voltage converter (VVC), to convert the voltage of the traction battery to an operational voltage level of the electric machine. The electric machine, that may include a traction motor, may require a high voltage and high current. Due to the voltage, current and switching requirements, a solid state switch such as an Insulated Gate Bipolar junction Transistor (IGBT) is typically used to generate the signals in the power inverter and the VVC. Likewise, the DC-DC or VVC has an inductor that may result in voltage spikes across the switch when the switch is open and energy is stored in the field of the inductor of the converter.

SUMMARY

A power module includes a first switch configured to drive a load and a first gate driver. The first gate driver is configured to output a fast turn-off signal when a current of the load is less than a threshold, latch a soft turn-off signal when the current exceeds the threshold for a period defined by a mask timer, and in response to a turn-off request received prior to expiration of the mask timer while the current exceeds the threshold, inhibit the fast turn-off signal for a duration greater than the period.

A method of controlling an IGBT includes outputting a fast turn-off signal when a load current is less than a threshold, latching a soft turn-off signal when the load current exceeds the threshold for a period defined by a mask timer, and in response to a turn-off request received prior to expiration of the mask timer while the load current exceeds the threshold, inhibiting the fast turn-off signal for a duration greater than the period.

A vehicle includes an electric machine configured to provide propulsive force to the vehicle, and a power inverter configured to supply power from a traction battery to the electric machine using a first and second switch configured as a half-bridge, wherein the first switch is controlled by a gate driver. The gate driver is configured to operate in a soft turn-off mode when a load current exceeds a threshold for a time period defined by a mask timer, operate in a fast turn-off mode when the load current is below the threshold, and in response to a turn-off request received prior to expiration of the mask timer after the load current exceeds the threshold, enable the soft turn-off mode.

DETAILED DESCRIPTION

Figure 1:
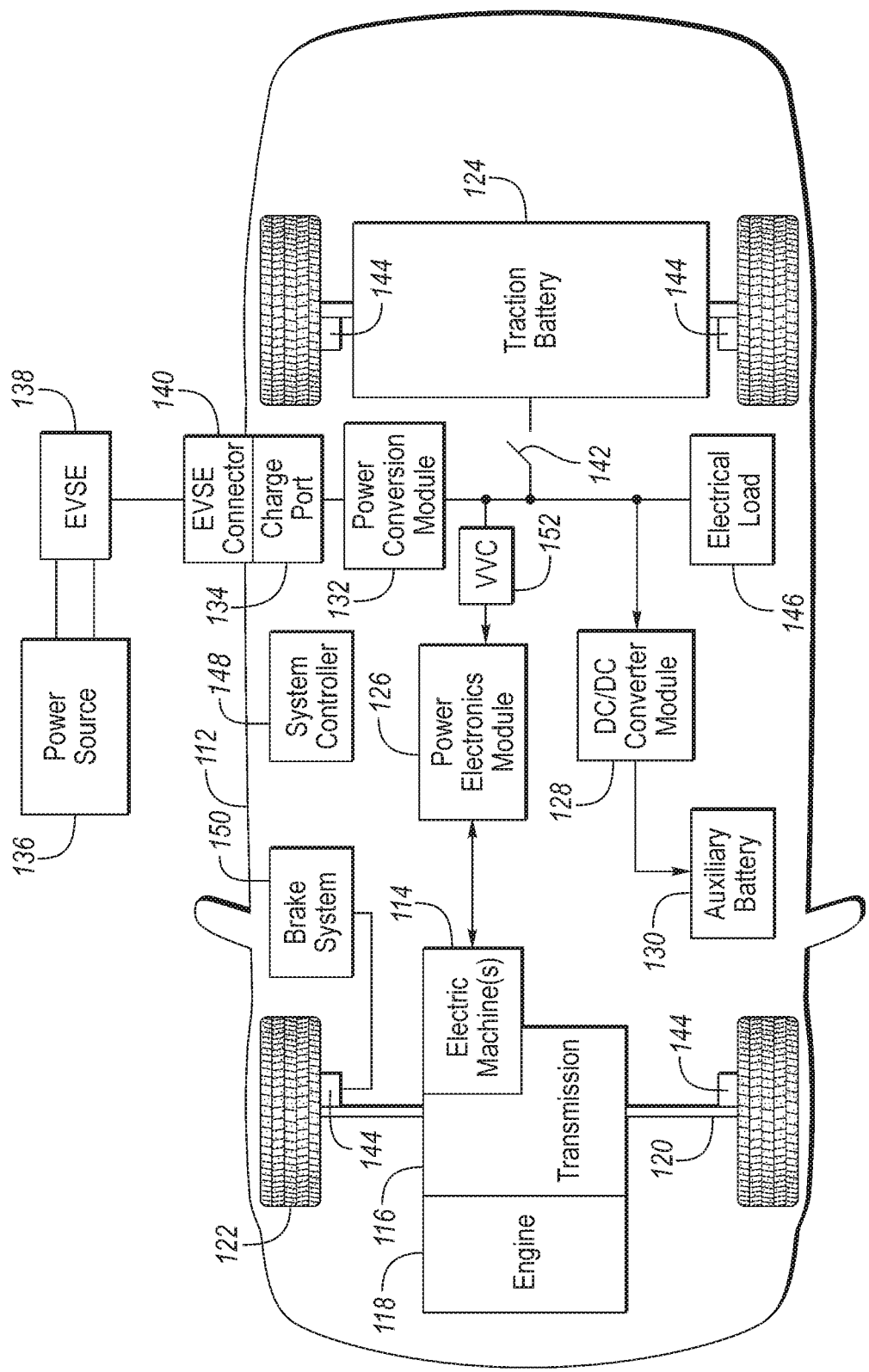
FIG. 1 is a diagram of a hybrid vehicle illustrating typical drivetrain and energy storage components with a variable voltage converter and power inverter therebetween.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Solid state devices (SSD), such as Insulated Gate Bipolar junction Transistors (IGBTs), Metal Oxide Semiconductor Field Effect Transistors (MOSFETs), or Bipolar Junction Transistors (BJTs) are widely used in a variety of automotive and industrial applications, such as electric motor drives, power inverters, DC-DC converters, and power modules. Operation of an IGBT and a MOSFET is voltage controlled, in which the operation is based on a voltage applied to a gate of the IGBT or MOSFET, while operation of a BJT is current controlled, in which the operation is based on a current applied to a base of the BJT. Here, the use of an IGBT will be discussed, however the structure and methods are applicable to other SSDs. Operation of an IGBT is controlled by a gate voltage supplied by a gate driver. Conventional gate drivers are typically based on a voltage, greater than a threshold voltage, applied to the IGBT gate with a current limiting resistor, which typically consists of a switchable voltage source and a gate resistor. A low gate resistance would lead to a fast switching speed and low switching loss, but may also cause higher stresses on the semiconductor devices, e.g. over-voltage stresses. Therefore, the gate resistance is selected to seek a compromise between switching loss, switching delay, and stresses. When turning off an IGBT, the gate resistor reduces the current flowing from the gate and thereby increases a shutoff time of the IGBT. Also, a gate driver may use different turn-on and turn-off gate resistors to separately control turn-on and turn-off switching speed.

Another factor to consider with respect to switching losses is shutting off a component when the component is in a fault condition, such as during a short circuit condition. Gate drivers that control or drive the switches (e.g., IGBTs) of a traction inverter in a hybrid electric vehicle or electric vehicle usually include a short circuit (SC) protection function to protect the switches. Typically, a gate driver chip receives an input gate signal and turns on/off the IGBT accordingly. During normal operating conditions, the turn-on and turn-off are achieved by outputting a signal to a control gate of the switch. For example, an "on" output may flow a current through an on resistance (Ron) and an "off" output may flow a current through an off resistance (Roff). When a short circuit condition occurs, SC protection may be triggered. The SC protection may include a "soft" output that may flow a current through a soft turn-off resistance (Rsoft). This soft turn-off resistance reduces the current flowing from the gate thereby increasing the transition time of the IGBT. The increase in transition time is considered softly turning off the switch. Typically, Rsoft is a larger resistance than the typical Roff thus reducing any surge voltage across the switching device. By reducing the surge voltage across the switch, the gate driver may protect the IGBT from a voltage breakdown when the current is very high. Also, the gate driver may report the SC fault to the system and certain system level protection strategy may be applied.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
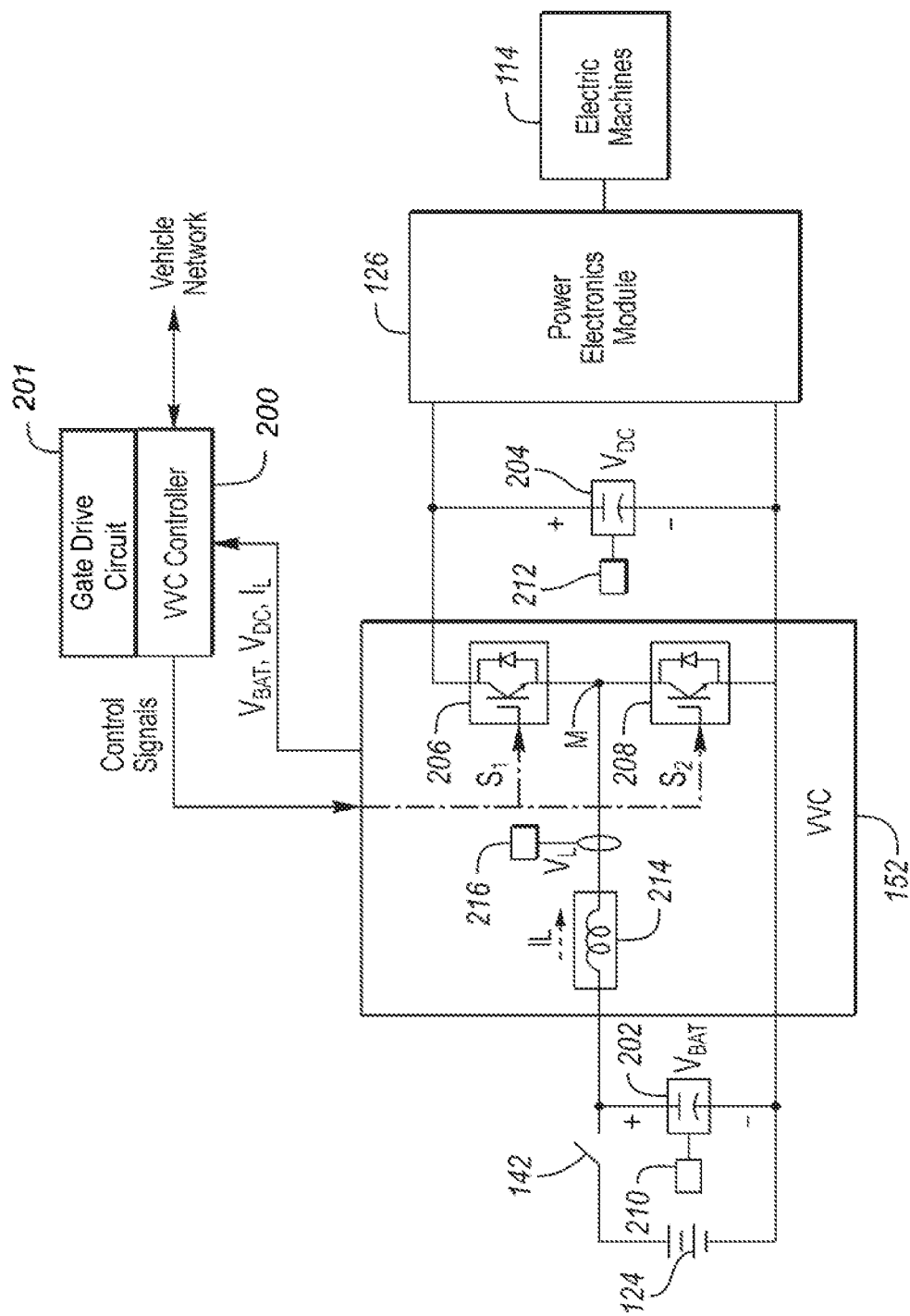
FIG. 2 is a schematic diagram of a vehicular variable voltage converter.

FIG. 2 depicts a diagram of a VVC 152 that is configured as a boost converter. The VVC 152 may include input terminals that may be coupled to terminals of the traction battery 124 through the contactors 142. The VVC 152 may include output terminals coupled to terminals of the power electronics module 126. The VVC 152 may be operated to cause a voltage at the output terminals to be greater than a voltage at the input terminals. The vehicle 112 may include a VVC controller 200 that monitors and controls electrical parameters (e.g., voltage and current) at various locations within the VVC 152. In some configurations, the VVC controller 200 may be included as part of the VVC 152. The VVC controller 200 may determine an output voltage reference, $V_{dc}^*$. The VVC controller 200 may determine, based on the electrical parameters and the voltage reference, $V_{dc}^*$, a control signal sufficient to cause the VVC 152 to achieve the desired output voltage. In some configurations, the control signal may be implemented as a pulse-width modulated (PWM) signal in which a duty cycle of the PWM signal is varied. The control signal may be operated at a predetermined switching frequency. The VVC controller 200 may command the VVC 152 to provide the desired output voltage using the control signal. The particular control signal at which the VVC 152 is operated may be directly related to the amount of voltage boost to be provided by the VVC 152.

The output voltage of the VVC 152 may be controlled to achieve a desired reference voltage. In some configurations, the VVC 152 may be a boost converter. In a boost converter configuration in which the VVC controller 200 controls the duty cycle, the ideal relationship between the input voltage $V_{in}$ and the output voltage $V_{out}$ and the duty cycle D may be illustrated using the following equation:

$$V_{out} = \frac{V_{in}}{(1-D)} \qquad 1)$$

The desired duty cycle, D, may be determined by measuring the input voltage (e.g., traction battery voltage) and setting the output voltage to the reference voltage. The VVC 152 may be a buck converter that reduces the voltage from input to output. In a buck configuration, a different expression relating the input and output voltage to the duty cycle may be derived. In some configurations, the VVC 152 may be a buck-boost converter that may increase or decrease the input voltage. The control strategy described herein is not limited to a particular variable voltage converter topology.

With reference to FIG. 2, the VVC 152 may boost or "step up" the voltage potential of the electrical power provided by the traction battery 124. The traction battery 124 may provide high voltage (HV) DC power. In some configurations, the traction battery 124 may provide a voltage between 150 and 400 Volts. The contactor 142 may be electrically coupled in series between the traction battery 124 and the VVC 152. When the contactor 142 is closed, the HV DC power may be transferred from the traction battery 124 to the VVC 152. An input capacitor 202 may be electrically coupled in parallel to the traction battery 124. The input capacitor 202 may stabilize the bus voltage and reduce any voltage and current ripple. The VVC 152 may receive the HV DC power and boost or "step up" the voltage potential of the input voltage according to the duty cycle.

An output capacitor 204 may be electrically coupled between the output terminals of the VVC 152. The output capacitor 204 may stabilize the bus voltage and reduce voltage and current ripple at the output of the VVC 152.

Further with reference to FIG. 2, the VVC 152 may include a first switching device 206 and a second switching device 208 for boosting an input voltage to provide the boosted output voltage. The switching devices 206, 208 may be configured to selectively flow a current to an electrical load (e.g., power electronics module 126 and electric machines 114). Each switching device 206, 208 may be individually controlled by a gate drive circuit 201 of the VVC controller 200 and may include any type of controllable switch (e.g., an insulated gate bipolar transistor (IGBT) or field-effect transistor (FET)). The gate drive circuit 201 may provide electrical signals to each of the switching devices 206, 208 that are based on the control signal (e.g., duty cycle of PWM control signal). A diode may be coupled across each of the switching devices 206, 208. The switching devices 206, 208 may each have an associated switching loss. The switching losses are those power losses that occur during state changes of the switching device (e.g., on/off and off/on transitions). The switching losses may be quantified by the current flowing through and the voltage across the switching device 206, 208 during the transition. The switching devices may also have associated conduction losses that occur when the device is switched on.

The vehicle system may include sensors for measuring electrical parameters of the VVC 152. A first voltage sensor 210 may be configured to measure the input voltage, (e.g., voltage of the battery 124), and provide a corresponding input signal ($V_{bat}$) to the VVC controller 200. In one or more embodiments, the first voltage sensor 210 may measure the voltage across the input capacitor 202, which corresponds to the battery voltage. A second voltage sensor 212 may measure the output voltage of the VVC 152 and provide a corresponding input signal ($V_{dc}$) to the VVC controller 200. In one or more embodiments, the second voltage sensor 212 may measure the voltage across the output capacitor 204, which corresponds to the DC bus voltage. The first voltage sensor 210 and the second voltage sensor 212 may include circuitry to scale the voltages to a level appropriate for the VVC controller 200. The VVC controller 200 may include circuitry to filter and digitize the signals from the first voltage sensor 210 and the second voltage sensor 212.

An input inductor 214 may be electrically coupled in series between the traction battery 124 and the switching devices 206, 208. The input inductor 214 may alternate between storing and releasing energy in the VVC 152 to enable the providing of the variable voltages and currents as VVC 152 output, and the achieving of the desired voltage boost. A current sensor 216 may measure the input current through the input inductor 214 and provide a corresponding current signal ($I_L$) to the VVC controller 200. The input current through the input inductor 214 may be a result of the voltage difference between the input and the output voltage of the VVC 152, the conducting time of the switching devices 206, 208, and the inductance L of the input inductor 214. The VVC controller 200 may include circuitry to scale, filter, and digitize the signal from the current sensor 216.

The VVC controller 200 may be programmed to control the output voltage of the VVC 152. The VVC controller 200 may receive input from the VVC 152 and other controllers via the vehicle network, and determine the control signals. The VVC controller 200 may monitor the input signals ($V_{bat}$, $V_{dc}$, $I_L$, $V_{dc}$*) to determine the control signals. For example, the VVC controller 200 may provide control signals to the gate drive circuit that correspond to a duty cycle command. The gate drive circuit may then control each switching device 206, 208 based on the duty cycle command.

The control signals to the VVC 152 may be configured to drive the switching devices 206, 208 at a particular switching frequency. Within each cycle of the switching frequency, the switching devices 206, 208 may be operated at the specified duty cycle. The duty cycle defines the amount of time that the switching devices 206, 208 are in an on-state and an off-state. For example, a duty cycle of 100% may operate the switching devices 206, 208 in a continuous on-state with no turn off. A duty cycle of 0% may operate the switching devices 206, 208 in a continuous off-state with no turn on. A duty cycle of 50% may operate the switching devices 206, 208 in an on-state for half of the cycle and in an off-state for half of the cycle. The control signals to the two switches 206, 208 may be complementary. That is, the control signal sent to one of the switching devices (e.g., 206) may be an inverted version of the control signal sent to the other switching device (e.g., 208). The use of complementary control of the switching devices 206, 208 is desirable to avoid a shoot-through condition in which current flows directly through a high-side switching device 206 and a low-side switching device 208. The high-side switching device 206 is also called a pass device 206 and the low-side switching device 208 is also called a charging device 208.

The current that is controlled by the switching devices 206, 208 may include a ripple component that has a magnitude that varies with a magnitude of the current, and the duty cycle and switching frequency of the switching devices 206, 208. Relative to the input current, the worst case ripple current magnitude occurs during relatively high input current conditions. When the duty cycle is fixed, an increase in the inductor current causes an increase in magnitude of the ripple current as illustrated in FIG. 4. The magnitude of the ripple current is also related to the duty cycle. The highest magnitude ripple current occurs when the duty cycle equals 50%. The general relationship between the inductor ripple current magnitude and the duty cycle may be as shown in FIG. 5. Based on these facts, it may be beneficial to implement measures to reduce the ripple current magnitude under high current and mid-range duty cycle conditions.

When designing the VVC 152, the switching frequency and the inductance value of the inductor 214 may be selected to satisfy a maximum allowable ripple current magnitude. The ripple component may be a periodic variation that appears on a DC signal. The ripple component may be defined by a ripple component magnitude and a ripple component frequency. The ripple component may have harmonics that are in an audible frequency range that may add to the noise signature of the vehicle. Further, the ripple component may cause difficulties with accurately controlling devices fed by the source. During switching transients, the switching devices 206, 208 may turn off at the maximum inductor current (DC current plus ripple current) which may cause large voltage spike across the switching devices 206, 208. Because of size and cost constraints, the inductance value may be selected based on the conducted current. In general, as current increases the inductance may decrease due to saturation.

The switching frequency may be selected to limit a magnitude of the ripple current component under worst case scenarios (e.g., highest input current and/or duty cycle close to 50% conditions). The switching frequency of the switching devices 206, 208 may be selected to be a frequency (e.g., 10 kHz) that is greater than a switching frequency of the motor/generator inverter (e.g., 5 kHz) that is coupled to an output of the VVC 152. In some applications, the switching frequency of the VVC 152 may be selected to be a predetermined fixed frequency. The predetermined fixed frequency is generally selected to satisfy noise and ripple current specifications. However, the choice of the predetermined fixed frequency may not provide best performance over all operating ranges of the VVC 152. The predetermined fixed frequency may provide best results at a particular set of operating conditions, but may be a compromise at other operating conditions.

Increasing the switching frequency may decrease the ripple current magnitude and lower voltage stress across the switching devices 206, 208, but may lead to higher switching losses. While the switching frequency may be selected for worst case ripple conditions, the VVC 152 may only operate under the worst case ripple conditions for a small percentage of the total operating time. This may lead to unnecessarily high switching losses that may lower fuel economy. In addition, the fixed switching frequency may concentrate the noise spectrum in a very narrow range. The increased noise density in this narrow range may result in noticeable noise, vibration, and harshness (NVH) issues.

The VVC controller 200 may be programmed to vary the switching frequency of the switching devices 206, 208 based on the duty cycle and the input current. The variation in switching frequency may improve fuel economy by reducing switching losses and reduce NVH issues while maintaining ripple current targets under worst case operating conditions.

During relatively high current conditions, the switching devices 206, 208 may experience increased voltage stress. At a maximum operating current of the VVC 152, it may be desired to select a relatively high switching frequency that reduces the ripple component magnitude with a reasonable level of switching losses. The switching frequency may be selected based on the input current magnitude such that as the input current magnitude increases, the switching frequency increases. The switching frequency may be increased up to a predetermined maximum switching frequency. The predetermined maximum switching frequency may be a level that provides a compromise between lower ripple component magnitudes and higher switching losses. The switching frequency may be changed in discrete steps or continuously over the operating current range.

The VVC controller 200 may be programmed to reduce the switching frequency in response to the current input being less than a predetermined maximum current. The predetermined maximum current may be a maximum operating current of the VVC 152. The change in the switching frequency may be based on the magnitude of the current input to the switching devices 206, 208. When the current is greater than the predetermined maximum current, the switching frequency may be set to a predetermined maximum switching frequency. As the current decreases, the magnitude of the ripple component decreases. By operating at lower switching frequencies as the current decreases, switching losses are reduced. The switching frequency may be varied based on the power input to the switching devices. As the input power is a function of the input current and the battery voltage, the input power and input current may be used in a similar manner.

Since the ripple current is also affected by the duty cycle, the switching frequency may be varied based on the duty cycle. The duty cycle may be determined based on a ratio of the input voltage to the output voltage. As such, the switching frequency may also be varied based on the ratio between the input voltage and the output voltage. When the duty cycle is near 50%, the predicted ripple current magnitude is a maximum value and the switching frequency may be set to the predetermined maximum frequency. The predetermined maximum frequency may be a maximum switching frequency value that is selected to minimize the ripple current magnitude. The switching frequency may be changed in discrete steps or continuously over the duty cycle range.

The VVC controller 200 may be programmed to reduce the switching frequency from the predetermined maximum frequency in response to a magnitude of a difference between the duty cycle and the duty cycle value (e.g, 50%) at which the predicted ripple component magnitude is a maximum. When the magnitude of the difference is less than a threshold, the switching frequency may be set to the predetermined frequency. When the magnitude of the difference decreases, the switching frequency may be increased toward the predetermined maximum frequency to reduce the ripple component magnitude. When the magnitude of the difference is less than a threshold, the switching frequency may be set to the predetermined maximum frequency.

The switching frequency may be limited to be between the predetermined maximum frequency and a predetermined minimum frequency. The predetermined minimum frequency may be a frequency level that is greater than a predetermined switching frequency of the power electronic module 126 that is coupled to an output of the variable voltage converter 152. The switching frequency may also be based on parasitic inductance associated with the gate of the IGBT.

Figure 3:
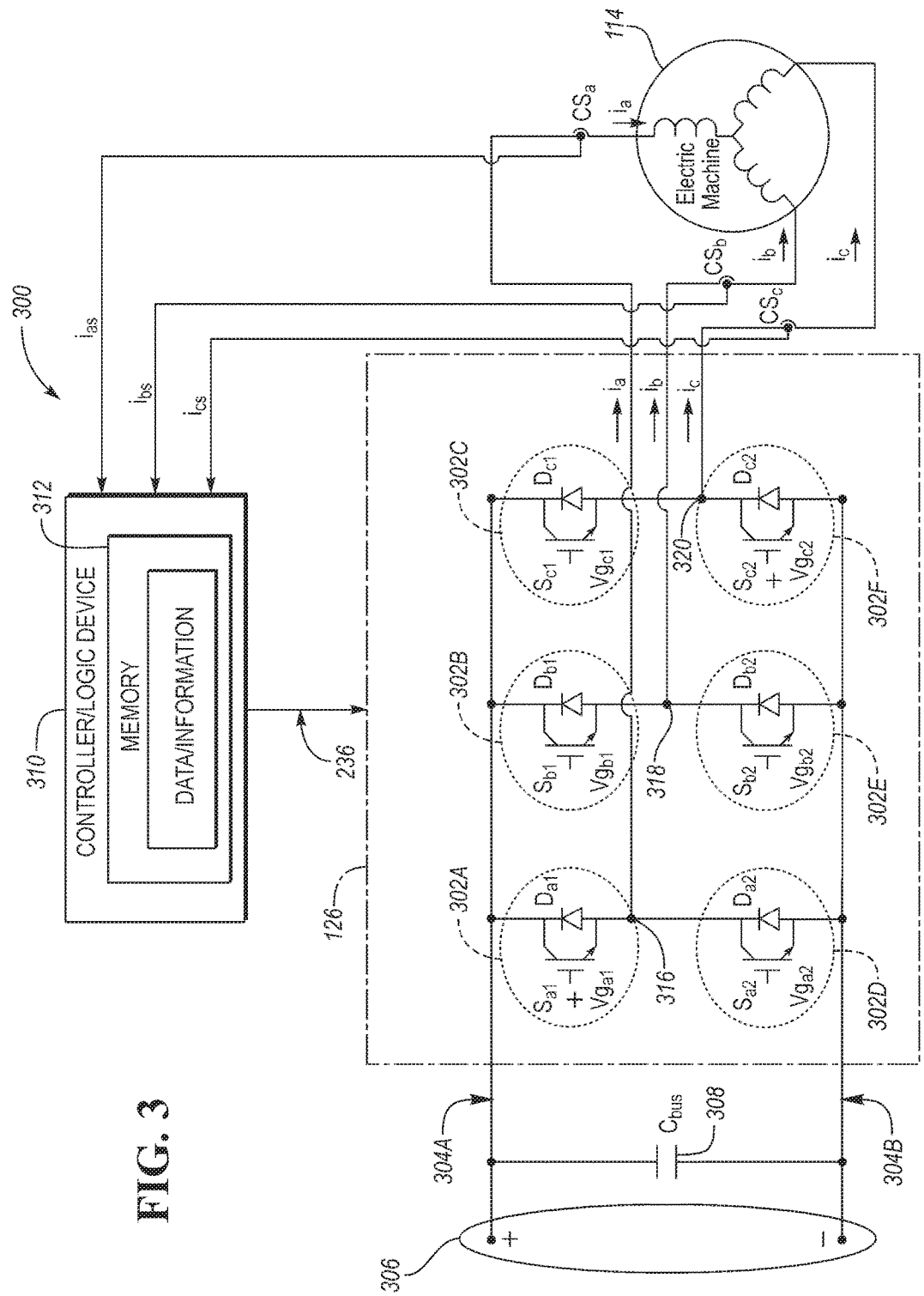
FIG. 3 is a schematic diagram of a vehicular electric machine inverter.

With reference to FIG. 3, a system 300 is provided for controlling a power electronics module (PEM) 126. The PEM 126 of FIG. 3 is shown to include a plurality of switches 302 (e.g., IGBTs) configured to collectively operate as an inverter with first, second, and third phase legs 316, 318, 320. While the inverter is shown as a three-phase converter, the inverter may include additional phase legs. For example, the inverter may be a four-phase converter, a five-phase converter, a six-phase converter, etc. In addition, the PEM 126 may include multiple converters with each inverter in the PEM 126 including three or more phase legs. For example, the system 300 may control two or more inverters in the PEM 126. The PEM 126 may further include a DC to DC converter having high power switches (e.g., IGBTs) to convert a power electronics module input voltage to a power electronics module output voltage via boost, buck or a combination thereof.

As shown in FIG. 3, the inverter may be a DC-to-AC converter. In operation, the DC-to-AC converter receives DC power from a DC power link 306 through a DC bus 304 and converts the DC power to AC power. The AC power is transmitted via the phase currents ia, ib, and ic to drive an AC machine also referred to as an electric machine 114, such as a three-phase permanent-magnet synchronous motor (PMSM) as depicted in FIG. 3. In such an example, the DC power link 306 may include a DC storage battery to provide DC power to the DC bus 304. In another example, the inverter may operate as an AC-to-DC converter that converts AC power from the AC machine 114 (e.g., generator) to DC power, which the DC bus 304 can provide to the DC power link 306. Furthermore, the system 300 may control the PEM 126 in other power electronic topologies.

With continuing reference to FIG. 3, each of the phase legs 316, 318, 320 in the inverter includes power switches 302, which may be implemented by various types of controllable switches. In one embodiment, each power switch 302 may include a diode and a transistor, (e.g., an IGBT). The diodes of FIG. 3 are labeled $D_{a1}$, $D_{a2}$, $D_{b1}$, $D_{b2}$, $D_{c1}$, and $D_{c2}$ while the IGBTs of FIG. 3 are respectively labeled $S_{a1}$, $S_{a2}$, $S_{b1}$, $S_{b2}$, $S_{c1}$, and $S_{c2}$. The power switches $S_{a1}$, $S_{a2}$, $D_{a1}$, and $D_{a2}$ are part of phase leg A of the three-phase converter, which is labeled as the first phase leg A 316 in FIG. 3. Similarly, the power switches $S_{b1}$, $S_{b2}$, $D_{b1}$, and $D_{b2}$ are part of phase leg B 318 and the power switches $S_{c1}$, $S_{c2}$, $D_{c1}$, and $D_{c2}$ are part of phase leg C 320 of the three-phase converter. The inverter may include any number of the power switches 302 or circuit elements depending on the particular configuration of the inverter. The diodes ($D_{xx}$) are connected in parallel with the IGBTs ($S_{xx}$) however, as the polarities are reversed for proper operation, this configuration is often referred to as being connected anti-parallel. A diode in this anti-parallel configuration is also called a freewheeling diode. Each phase leg may be view as two switches configured in a half-bridge configuration and a typical three phase power inverter includes three half-bridges.

As illustrated in FIG. 3, current sensors $CS_a$, $CS_b$, and $CS_c$ are provided to sense current flow in the respective phase legs 316, 318, 320. FIG. 3 shows the current sensors $CS_a$, $CS_b$, and $CS_c$ separate from the PEM 126. However, current sensors $CS_a$, $CS_b$, and $CS_c$ may be integrated as part of the PEM 126 depending on its configuration. Current sensors $CS_a$, $CS_b$, and $CS_c$ of FIG. 3 are installed in series with each of phase legs A, B and C (i.e., phase legs 316, 318, 320 in FIG. 3) and provide the respective feedback signals $i_{as}$, $i_{bs}$, and $i_{cs}$ (also illustrated in FIG. 3) for the system 300. The feedback signals $i_{as}$, $i_{bs}$, and $i_{cs}$ may be raw current signals processed by logic device (LD) 310 or may be embedded or encoded with data or information about the current flow through the respective phase legs 316, 318, 320. Also, the power switches 302 (e.g., IGBTs) may include current sensing capability. The current sensing capability may include being configured with a current mirror output, which may provide data/signals representative of $i_{as}$, $i_{bs}$, and $i_{cs}$. The data/signals may indicate a direction of current flow, a magnitude of current flow, or both the direction and magnitude of current flow through the respective phase legs A, B, and C.

Referring again to FIG. 3, the system 300 includes a logic device (LD) or controller 310. The controller or LD 310 can be implemented by various types or combinations of electronic devices and/or microprocessor-based computers or controllers. To implement a method of controlling the PEM 126, the controller 310 may execute a computer program or algorithm embedded or encoded with the method and stored in volatile and/or persistent memory 312. Alternatively, logic may be encoded in discrete logic, a microprocessor, a microcontroller, or a logic or gate array stored on one or more integrated circuit chips. As shown in the embodiment of FIG. 3, the controller 310 receives and processes the feedback signals $i_{as}$, $i_{bs}$, and $i_{cs}$ to control the phase currents $i_a$, $i_b$, and $i_c$ such that the phase currents $i_a$, $i_b$, and $i_c$ flow through the phase legs 316, 318, 320 and into the respective windings of the electric machine 114 according to various current or voltage patterns. For example, current patterns can include patterns of phase currents $i_a$, $i_b$, and $i_c$ flowing into and away from the DC-bus 304 or a DC-bus capacitor 308. The DC-bus capacitor 308 of FIG. 3 is shown separate from the PEM 126. However, the DC-bus capacitor 308 may be integrated as part of the PEM 126.

As shown in FIG. 3, a storage medium 312 (hereinafter "memory"), such as computer-readable memory may store the computer program or algorithm embedded or encoded with the method. In addition, the memory 312 may store data or information about the various operating conditions or components in the PEM 126. For example, the memory 312 may store data or information about current flow through the respective phase legs 316, 318, 320. The memory 312 can be part of the controller 310 as shown in FIG. 3. However, the memory 312 may be positioned in any suitable location accessible by the controller 310.

As illustrated in FIG. 3, the controller 310 transmits at least one control signal 236 to the power converter system 126. The power converter system 126 receives the control signal 322 to control the switching configuration of the inverter and therefore the current flow through the respective phase legs 316, 318, and 320. The switching configuration is a set of switching states of the power switches 302 in the inverter. In general, the switching configuration of the inverter determines how the inverter converts power between the DC power link 306 and the electric machine 114.

To control the switching configuration of the inverter, the inverter changes the switching state of each power switch 302 in the inverter to either an ON state or an OFF state based on the control signal 322. In the illustrated embodiment, to switch the power switch 302 to either ON or OFF states, the controller/LD 310 provides the gate voltage (Vg) to each power switch 302 and therefore drives the switching state of each power switch 302. Gate voltages $Vg_{a1}$, $Vg_{a2}$, $Vg_{b1}$, $Vg_{b2}$, $Vg_{c1}$, and $Vg_{c2}$ (shown in FIG. 3) control the switching state and characteristics of the respective power switches 302. While the inverter is shown as a voltage-driven device in FIG. 3, the inverter may be a current-driven device or controlled by other strategies that switch the power switch 302 between ON and OFF states. The controller 310 may change the gate drive for each IGBT based on the rotational speed of the electric machine 114, the mirror current, or a temperature of the IGBT switch. The change in gate drive may be selected from a plurality of gate drive currents in which the change gate drive current is proportional to a change in IGBT switching speed.

As also shown in FIG. 3, each phase leg 316, 318, and 320 includes two switches 302. However, only one switch in each of the legs 316, 318, 320 can be in the ON state without shorting the DC power link 306. Thus, in each phase leg, the switching state of the lower switch is typically opposite the switching state of the corresponding upper switch. The top switches are typically referred to as high-side switches (i.e., 302A, 302B, 302C) and the lower switches are typically referred to as low-side switches (i.e., 302D, 302E, 302F). Consequently, a HIGH state of a phase leg refers to the upper switch in the leg in the ON state with the lower switch in the OFF state. Likewise, a LOW state of the phase leg refers to the upper switch in the leg in the OFF state with the lower switch in the ON state. As a result, IGBTs with current mirror capability may be on all IGBTs, a subset of IGBTs (e.g., $S_{a1}$, $S_{b1}$, $S_{c1}$) or a single IGBT.

Two situations can occur during an active state of the three-phase converter example illustrated in FIG. 2: (1) two phase legs are in the HIGH state while the third phase leg is in the LOW state, or (2) one phase leg is in the HIGH state while the other two phase legs are in the LOW state. Thus, one phase leg in the three-phase converter, which may be defined as the "reference" phase for a specific active state of the inverter, is in a state opposite to the other two phase legs, or "non-reference" phases, that have the same state. Consequently, the non-reference phases are either both in the HIGH state or both in the LOW state during an active state of the inverter.

Figure 4A:
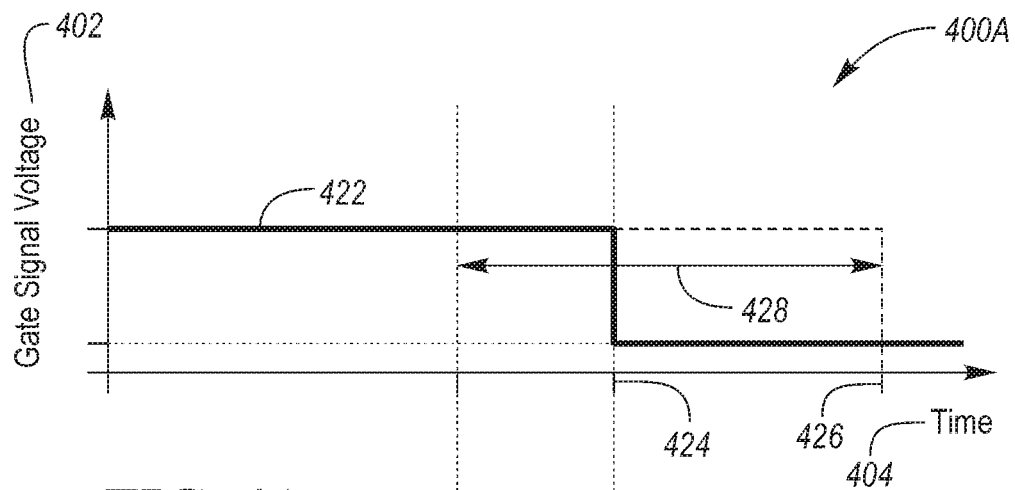
FIG. 4A is a graphical illustration of a voltage applied to a gate of a switch with respect to time.
Figure 4B:
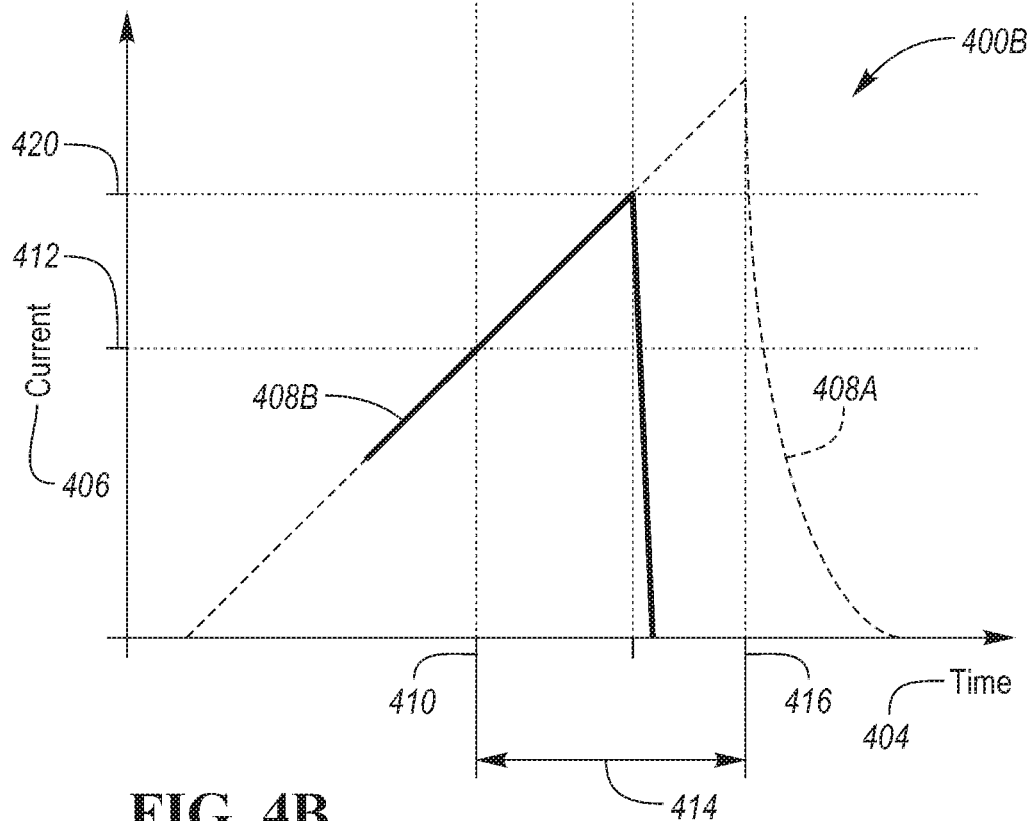
FIG. 4B is a graphical illustration of a load current driven by the switch with respect to time.
Figure 5:
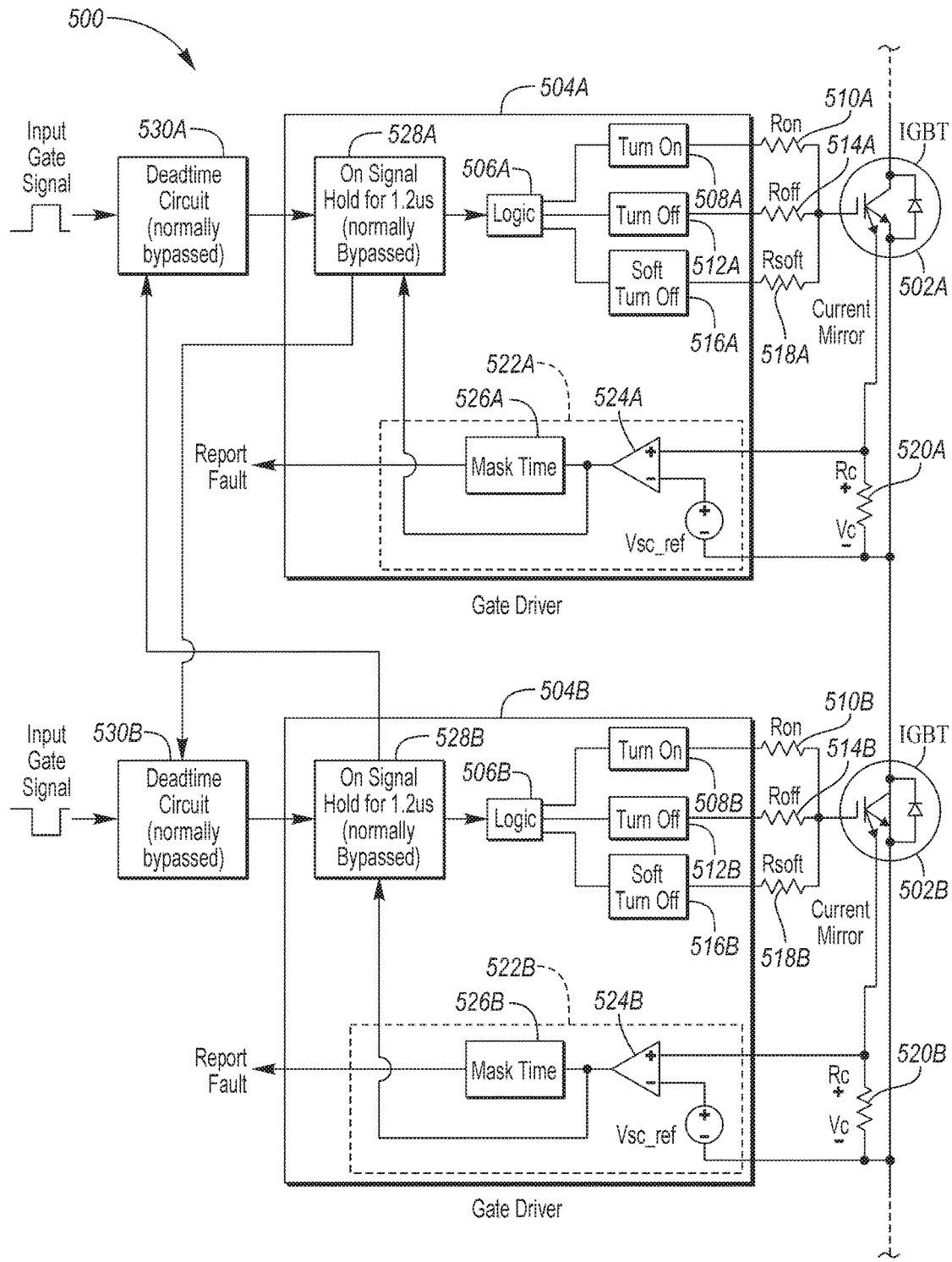
FIG. 5 is a schematic diagram of dual gate drive circuits for two IGBTs including short circuit protection via a soft turn-off with a cross dead time delay.

FIG. 4A is a graphical illustration 400A of a voltage 402 applied to a gate of a switch with respect to time 404, and FIG. 4B is a graphical illustration 400B of a load current 406 driven by the switch with respect to time 404. These illustrations depict a soft turn-off waveform 408A of a switch (e.g., IGBT) when SC protection is successfully triggered and a fast turn-off 408B that is triggered after the current 406 exceeds a short circuit threshold 412 at time t1 410. Before t1 410, the switch is on and conducting thereby causing an increase to the current 408. At t1 410, the switch current 408 reaches the SC protection threshold 412. After a short circuit protection delay time 414, soft turn-off may be activated. The short circuit protection delay time 414 may be based on criteria including averaging, filtering, and measuring. The measuring may be performed by a comparator, an A/D converter, or may be performed in a remote sensor. For example, for a system that uses a comparator to measure, a propagation delay through the comparator may be part of the criteria of the short circuit protection delay time 414. In a system that uses a remote sensor, a propagation delay of the measuring and transmitting by the remote sensor and receiving by the controller may be part of the criteria of the short circuit protection delay time 414. Also, the averaging and filtering may include use of an analog or digital filter such as a Finite Impulse Response (FIR) filter, an Infinite Impulse Response (IIR) filter, or another common filter in which a propagation delay to perform the filter may be part of the criteria of the short circuit protection delay time 414. The averaging may include operation of a timer in which the timer counts (down or up) and upon an event such as an overflow, underflow, or a match of the timer with a time period value, the timer may output a signal. The period of the timer may be part of the criteria of the short circuit protection delay time 414. The signal may be used by the controller to latch, select, or enter an operational mode, or perform a specific task. For example, if the current 408 has not dropped below a threshold 412 during the period 414 (e.g., before the mask timer expires) the controller may initiate a soft turn-off at time t2 416.

However, there are instances in which the SC protection (e.g., soft turn-off) is not successfully triggered due to the SC protection delay time 414 not expiring before a turn-off request. For example, in FIG. 4B, a turn-off request is shown to occur prior to an expiration of the propagation delay through the comparator that is be part of the criteria of the short circuit protection delay time 414. As such, a fast turn-off 408B is triggered at time t3 424 when the current is at a level 420 above the short circuit threshold 412. As the soft turn-off has not yet been initiated or enabled, the gate voltage 422 transitions low at point t3 424 using the normal or fast turn-off (e.g., using a standard off resistance Roff). As this turn off was performed during a short circuit of the load, the fast turn-off is a hard turn-off in that the low gate resistance of the switch allows the switch to transition quickly. When the switch is driving a high current, the hard turn-off may possibly damage the switch. The hard turn-off in conjunction with a high-current flowing through an inductor results in a voltage spike across the switch.

A solution may be to delay or inhibit the turn-off request for a delay period 428 that is greater than the short circuit protection delay time 414, thereby allowing the short circuit protection delay time 414 to expire triggering a soft turn-off at time t2 416.

FIG. 5 is a schematic diagram 500 of dual gate drive circuits 504A, 504B for two switches 502A, 502B including short circuit protection via a soft turn-off with a cross dead time delay. This schematic diagram 500 can be examined as a first circuit and a second circuit in which the first circuit includes the elements ending with an "A" and the second circuit includes the elements ending with a "B". The first circuit has a switch 502A illustrated as an N-channel IGBT having a collector, a gate, a load emitter, a Kelvin emitter and a sense emitter. The switch 502A is coupled with a gate driver 504A having logic 506A that controls a turn-on output 508A configured to flow a current to the gate of the switch 502A through an on resistor 510A, a fast turn-off output 512A configured to flow a current to the gate of the switch 502A through an on resistor 514A, and a soft turn-off output 516A configured to flow a current to the gate of the switch 502A through an on resistor 518A. The switch is coupled with a current sensor 520A illustrated as a resistor coupled between a current sense emitter and a Kelvin emitter. The current sensor 520A is monitored by a current sense monitor 522A illustrated here including a voltage comparator 524A and a mask timer 526A. Here, the mask timer 526A outputs a fault from the gate driver 504A, and a hold or delay circuit 528A that receives a raw or unfiltered signal from the comparator 524A of the current sensor 520A. The hold circuit 528A can be used to drive a dead-time circuit 530B for the second circuit, while a dead-time circuit 530A for the first circuit is driven by the second circuit, and the dead-time circuit 530A is used to delay a turn-on request to the gate driver 504A. Although shown separate, the dead-time circuit 530A may be integrated with the gate driver 504A.

Similar to the first circuit, the second circuit has a switch 502B illustrated as an N-channel IGBT having a collector, a gate, a load emitter, Kelvin emitter, and a sense emitter. The switch 502B is coupled with a gate driver 504B having logic 506B that controls a turn-on output 508B configured to flow a current to the gate of the switch 502B through an on resistor 510B, a fast turn-off output 512B configured to flow a current to the gate of the switch 502B through an on resistor 514B, and a soft turn-off output 516B configured to flow a current to the gate of the switch 502B through an on resistor 518B. The switch is coupled with a current sensor 520B illustrated as a resistor coupled between a current sense emitter and a Kelvin emitter. The current sensor 520B is monitored by a current sense monitor 522B illustrated here including a voltage comparator 524B and a mask timer 526B. Here, the mask timer 526B outputs a fault from the gate driver 504B, and a hold or delay circuit 528B that receives a raw or unfiltered signal from the comparator 524B of the current sensor 520B. The hold circuit 528B can be used to drive a dead-time circuit 530A for the first circuit, while a dead-time circuit 530B for the second circuit is driven by the first circuit, and the dead-time circuit 530B is used to delay a turn-on request to the gate driver 504B. Although shown separate, the dead-time circuit 530B may be integrated with the gate driver 504B.

Figure 6:
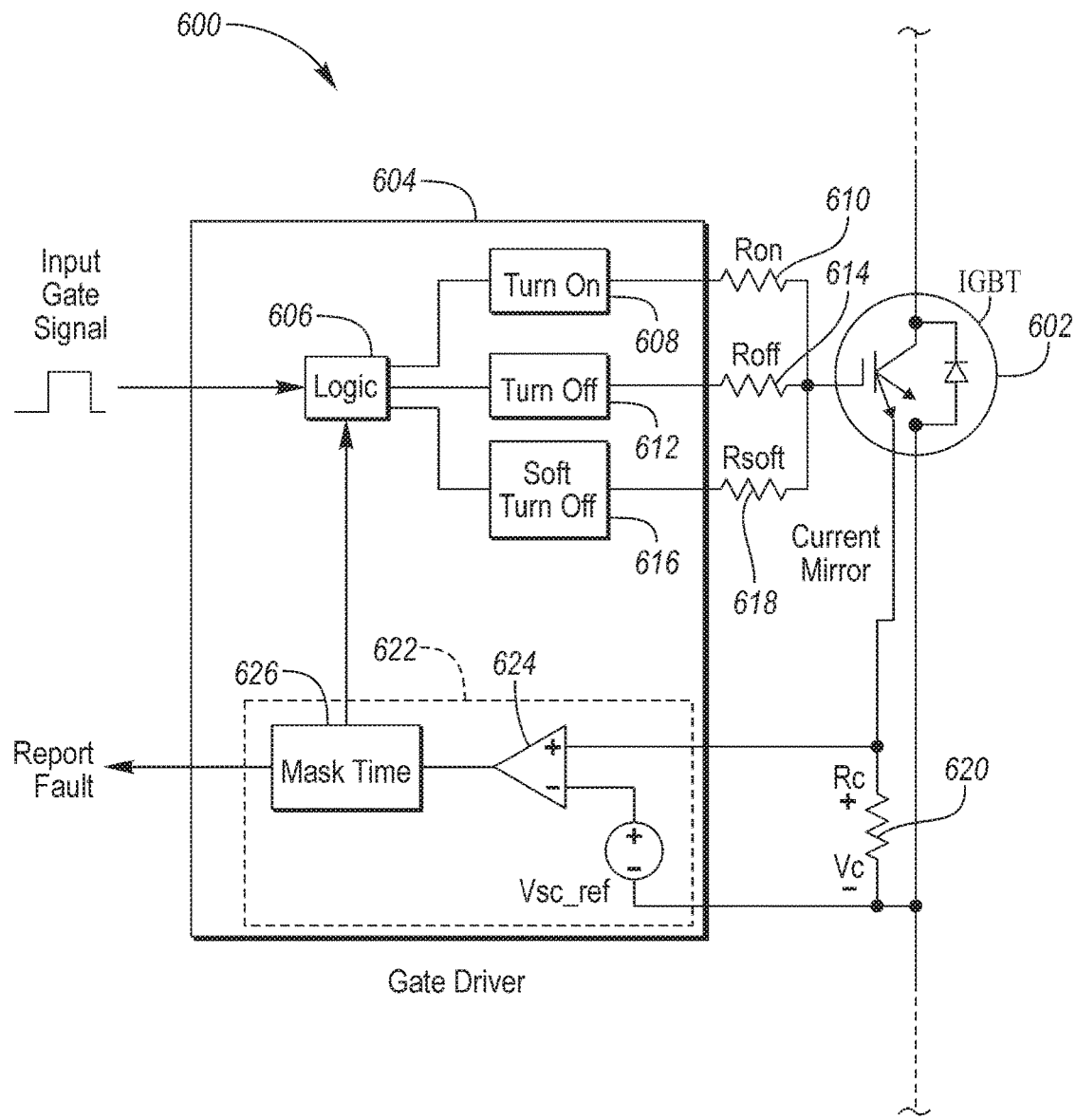
FIG. 6 is a schematic diagram of a gate drive circuit for an IGBT having short circuit protection via a soft turn-off.

FIG. 6 is a schematic diagram 600 of a traditional gate drive circuit 604 for an IGBT 602 having short circuit protection via a soft turn-off. The IGBT 602 is coupled with a gate driver 604 having logic 606 that controls a turn-on output 608 configured to flow a current to the gate of the IGBT 602 through an on resistor 610, a fast turn-off output 612 configured to flow a current to the gate of the IGBT 602 through an on resistor 614, and a soft turn-off output 616 configured to flow a current to the gate of the IGBT 602 through an on resistor 618. The IGBT is coupled with a current sensor 620 illustrated as a resistor coupled between a current sense emitter and a Kelvin emitter. The current sensor 620 is monitored by a current sense monitor 622 illustrated here including a voltage comparator 624 and a mask timer 626. An output of the mask timer 626 is received by the logic 606 control turn-on and turn-off including enabling, latching, or initiating a soft turn-off via the soft turn-off output 616.

Figure 7:
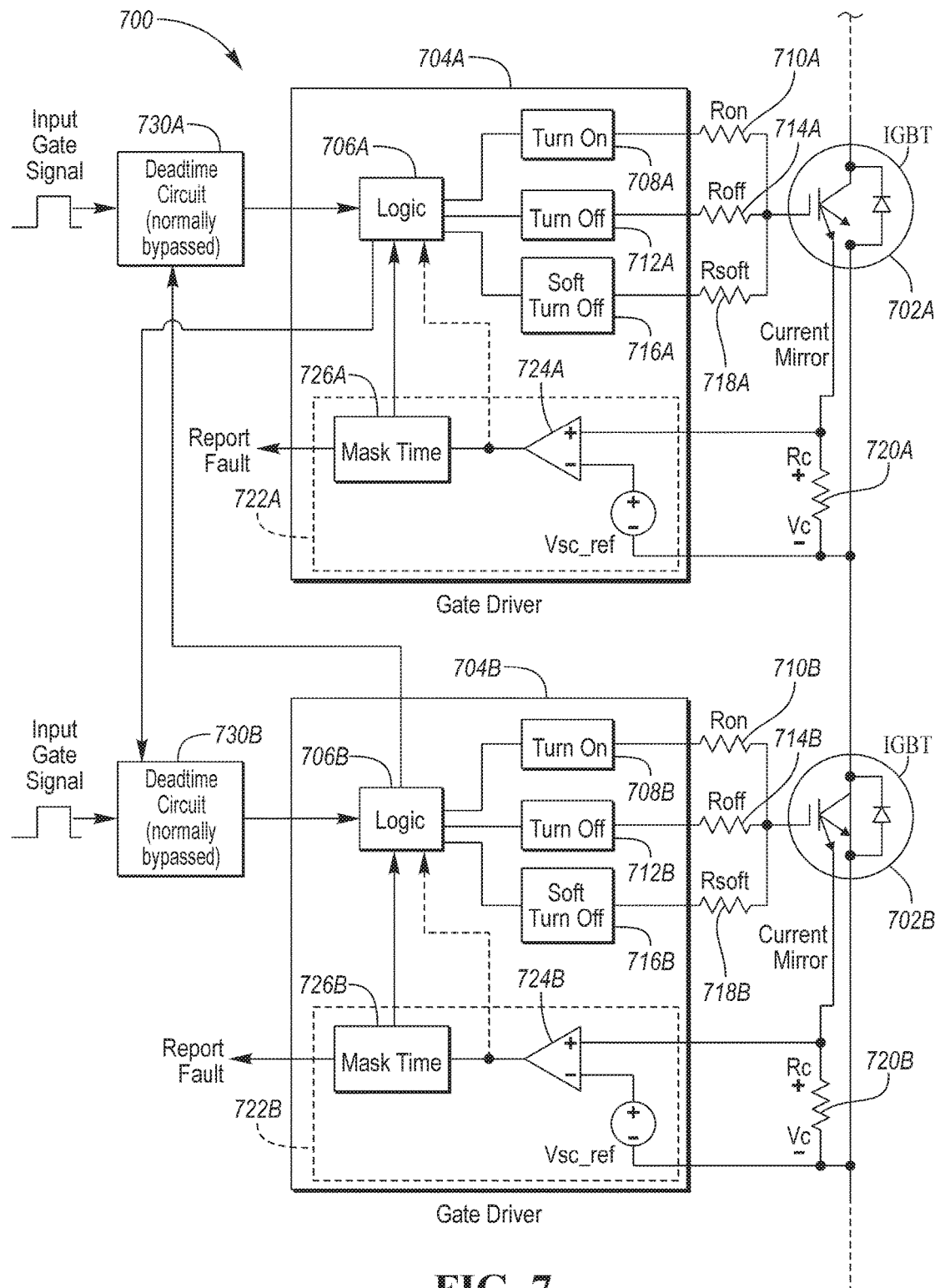
FIG. 7 is a schematic diagram of dual gate drive circuits for two IGBTs including short circuit protection using raw current feedback to enable a soft turn-off with a cross dead time delay.

FIG. 7 is a schematic diagram 700 of dual gate drive circuits 704A, 704B for two IGBTs 702A, 702B including short circuit protection using raw current feedback to enable a soft turn-off with a cross dead-time delay. Similar to FIG. 5, this schematic diagram 700 can be examined as a first circuit and a second circuit in which the first circuit includes the elements ending with an "A" and the second circuit includes the elements ending with a "B". The first circuit has a switch 702A illustrated as an N-channel IGBT having a collector, a gate, a load emitter, a Kelvin emitter and a sense emitter. The switch 702A is coupled with a gate driver 704A having logic 706A that controls a turn-on output 708A configured to flow a current to the gate of the switch 702A through an on resistor 710A, a fast turn-off output 712A configured to flow a current to the gate of the switch 702A through an on resistor 714A, and a soft turn-off output 716A configured to flow a current to the gate of the switch 702A through an on resistor 718A. The switch is coupled with a current sensor 720A illustrated as a resistor coupled between a current sense emitter and a Kelvin emitter. The current sensor 720A is monitored by a current sense monitor 722A illustrated here including a voltage comparator 724A and a mask timer 726A. Here, the mask timer 726A outputs a fault from the gate driver 704A, and the control logic 706A receives a raw or unfiltered signal from the comparator 724A of the current sensor 720A. The control logic 706A can be used to drive a dead-time circuit 730B for the second circuit, while a dead-time circuit 730A for the first circuit is driven by the second circuit, and the dead-time circuit 730A is used to delay a turn-on request to the gate driver 704A. Although shown separate, the dead-time circuit 730A may be integrated with the gate driver 704A.

Similar to the first circuit, the second circuit has a switch 702B illustrated as an N-channel IGBT having a collector, a gate, a load emitter, a Kelvin emitter, and a sense emitter. The switch 702B is coupled with a gate driver 704B having logic 706B that controls a turn-on output 708B configured to flow a current to the gate of the switch 702B through an on resistor 710B, a fast turn-off output 712B configured to flow a current to the gate of the switch 702B through an on resistor 714B, and a soft turn-off output 716B configured to flow a current to the gate of the switch 702B through an on resistor 718B. The switch is coupled with a current sensor 720B illustrated as a resistor coupled between a current sense emitter and a Kelvin emitter. The current sensor 720B is monitored by a current sense monitor 722B illustrated here including a voltage comparator 724B and a mask timer 726B. Here, the mask timer 726B outputs a fault from the gate driver 704B, and control logic 706B receives a raw or unfiltered signal from the comparator 724B of the current sensor 720B. The control logic 706B can be used to drive a dead-time circuit 730A for the first circuit, while a dead-time circuit 730B for the second circuit is driven by the first circuit, and the dead-time circuit 730B is used to delay a turn-on request to the gate driver 704B. Although shown separate, the dead-time circuit 730B may be integrated with the gate driver 704B.

The function of SC protection may be implemented by components shown in FIG. 5, 6, or 7, such as the current sense monitor 522 coupled with current sensor 520 or the current sense monitor 722 coupled with current sensor 720, however, other embodiments may be used. For example, in place of a current sensor in series with a current sense emitter, a current sensor (CSa, CSb, or CSb) as shown in FIG. 3 or the current sensor 216 of FIG. 2 may be used. Referring back to FIGS. 5, 6, and 7, the IGBT current mirror or current sense outputs is typically a small fraction of the current flowing through the load emitter of the switch, illustrated as IGBTs. Here, the current sensor 520, 620, 720 is a resistor in which a voltage across the resistor (Vc) is an input to the current sense monitor 522, 622, 722 of the gate driver 504, 604, 704. Vc is compared with an internal reference voltage Vsc_ref, that is a SC protection threshold. When Vc is greater than Vsc_ref, the comparator toggles and the SC protection is triggered. Typically, Vc is measured in an environment in which there is electro-magnetic interference (EMI), as such, the current sense signal typically has noise caused by many factors including a switching transient of the switches 502, 602, 702. A mask timer 526, 626, 726 may be used to increase system stability by reducing false SC trigger events.

The mask timer may be configured to hold, average, filter, or otherwise condition the signal from the current sensor. One method would be the use of a short circuit protection delay that may be based on criteria such as averaging, filtering, measuring, or other signal conditioning to increase stability. Here, measuring may be performed by a comparator, an A/D converter, or it may be a digital or analog signal received by a controller or logic from a remote sensor. A propagation delay may be a component of the short circuit protection delay time in a system that uses a comparator or A/D converter. While for a remote sensor system, a propagation delay may include measuring and transmitting by the remote sensor and receiving by the controller or logic. The averaging, filtering, or other conditioning may include use of an analog or digital filter such as a FIR filter, an IIR filter, or other common filter or control loop in which a propagation delay to perform the operation may be part of the criteria of the short circuit protection delay time. The averaging may include operation of a timer in which the timer counts (down or up) and upon an event such as an overflow, underflow, or a match of the timer with a time period value, the timer may output a signal. The period of the timer may be part of the criteria of the short circuit protection delay time. The signal may be used by the controller to latch, select, or enter an operational mode, or perform a specific task. For example, if the current measured by the current sensor has not dropped below the threshold during the period (e.g., before the mask timer expires) the controller may initiate a soft turn-off. In practice, the SC protection delay time that includes the comparator delay and the mask timer is typically 1 us. Often the mask timer includes a time base that set a rate that the timer will either increment or decrement, a time register is a register that hold a current value of a count register that is decremented or incremented at the rate defined by time base, and a reload register. When referring to expiration of the mask timer, typically includes a timer in a decrementing mode that either underflows or matches the value of the reload register, a timer in a incrementing mode that either overflows or matches the value of the reload register or other way in the industry to use a timer to generate a period or another way common in the industry to generate a time base.

Referring back to FIG. 5, specifically the hold/delay circuit 528A, 528B. In a system with a SC protection delay time of 1 us, the hold/delay circuit may be configured to hold the on-signal for 1.2 us (i.e., longer than the SC delay time) regardless of the input signal, once the SC threshold is reached. This may avoid a condition in which the IGBT is subject to a hard turned off by the original input signal. The hold/delay circuit 528A, 528B may be separate logic or may be integrated with the control logic 506A, 506B. For example, the hold/delay circuit 528A, 528B may be combinational logic, an independent timer (e.g., an external timer such as an LM555), or a timer integrated into a microcontroller or programmable logic device. The switching waveform is shown in FIG. 4B in which the IGBT current reaches SC threshold at t1 410. The input gate on-signal is extended by 1.2 us at point 426 and before the 1.2 us delay time is reached, the SC protection circuit can softly turn off the IGBT at t2 416.

When the gate on-signal is extended by 1.2 us as described using the hold/delay circuit 528A, 528B of FIG. 5, the possibility of cross conduction between the upper and lower switch may be increased. The upper and lower switches typically are used when configured as a half-bridge of a power inverter as shown in FIG. 3. A dead-time circuit 530A, 530B is added before each gate driver input as shown in FIG. 5. The dead-time circuit 530A, 530B delays the turn-on signal by 1.2 us. The dead-time circuit 530A, 530B is normally bypassed, so the circuit does not produce any interference with the system normal operation. In case when an upper/lower switch on-signal has been modified, the delay of the dead-time circuit 530A, 530B may be modified to protect against shoot through occurring with the lower/upper devices.

Referring to the embodiment illustrated in FIG. 7 compared with the conventional solution, the system of FIG. 7 sends a soft turn-off enable signal to the gate driver logic whenever the SC threshold is reached. Here, the soft turn-off enable signal is a raw or unprocessed signal, the term raw or unprocessed signal generally refers to a signal having none or limited additional filtering, latching, or delaying, beyond the logic needed to generate the signal. Therefore, in response to an input turn-off signal while the SC threshold is exceeded, the soft turn-off will be enabled. This avoids a hard turn-off condition of the IGBT by a presence of the input signal before the delay time is reached. This system may be operated in noisy environments due to a signal that triggers the SC threshold only slows down the turn-off speed. Moreover, with the addition of the dead-time delay circuit, if the soft turn-off speed is slow enough that it may cause cross conduction of upper and lower IGBTs, the normally bypassed dead-time circuit can be triggered.

The conventional gate driver short circuit function with the additional delay time can be used to avoid the noise triggering of the SC protection. Due to the SC protection delay time, there may be scenarios that cannot be adequately covered by a conventional gate driver SC protection. Here, proposed solutions can successfully avoid those scenarios and successfully achieve a level of SC protection. The proposed solutions are simple and with limited or no increase in system cost.

Control logic or functions performed by controller may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but are provided for ease of illustration and description. The control logic may be implemented primarily in software executed by a microprocessor-based vehicle, engine, and/or powertrain controller, such as controller. Of course, the control logic may be implemented in software, hardware, or a combination of software and hardware in one or more controllers depending upon the particular application. When implemented in software, the control logic may be provided in one or more computer-readable storage devices or media having stored data representing code or instructions executed by a computer to control the vehicle or its subsystems. The computer-readable storage devices or media may include one or more of a number of known physical devices which utilize electric, magnetic, and/or optical storage to keep executable instructions and associated calibration information, operating variables, and the like.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle power module comprising:
a first switch configured to drive a load; and
a first gate driver configured to
output a fast turn-off signal when a current of the load is less than a threshold;
responsive to a current of the load exceeding the threshold for a period defined by a mask timer, output a soft turn-off signal to the first switch, and
responsive to a turn-off request received prior to expiration of the mask timer while the current exceeds the threshold, inhibit output of the fast turn-off signal to the first switch for a duration greater than the period.

2. The vehicle power module of claim 1 further including a second switch and a second gate driver coupled with the second switch, wherein the first gate driver is further configured to, responsive to the current exceeding the threshold, delay a turn-on request from the second gate driver to the second switch by a dead time.

3. The vehicle power module of claim 2, wherein the first and second switches are configured as a half bridge.

4. The vehicle power module of claim 3, wherein the first and second switches are Insulated Gate Bipolar Junction Transistors (IGBTs) or Metal Oxide Semiconductor Field Effect Transistors (MOSFETs).

5. The vehicle power module of claim 4, wherein the period is a short-circuit protection delay that includes a time to measure the current.

6. The vehicle power module of claim 5, wherein the time is a delay time of a comparator coupled between a voltage across a resistor coupled between a sense emitter and a Kelvin emitter of the IGBT, and a short circuit reference voltage.

7. The vehicle power module of claim 2, wherein the first and second switches are configured as a half bridge to flow the current from a traction battery to an electric machine that is configured to provide a propulsive force to a vehicle.

8. The vehicle power module of claim 2, wherein the current is a current flowing from a traction battery to an inductor that is configured to boost a voltage of the traction battery to an operation voltage for an electric machine that is configured to provide a propulsive force to a vehicle.

9. A method of controlling an IGBT of a vehicle power module comprising:

outputting a fast turn-off signal to the IGBT when a load current is less than a threshold;

outputting a soft turn-off signal to the IGBT responsive to the load current exceeding the threshold for a period defined by a mask timer; and inhibiting output of the fast turn-off signal to the IGBT for a duration greater than the period responsive to a turn-off request being received prior to expiration of the mask timer while the load current exceeds the threshold.

10. The method of claim 9, wherein the IGBT is a high-side switch of a power inverter of a vehicle, and the load current is a traction battery current flowing to an electric machine that is configured to provide a propulsive force to the vehicle.

11. The method of claim 9, wherein the IGBT is a high-side switch of a DC-DC converter of a vehicle, and the load current is a current flowing from a traction battery to an inductor that is configured to boost a voltage of the traction battery to an operation voltage for an electric machine that is configured to provide a propulsive force to the vehicle.

12. The method of claim 9, wherein the period is a short-circuit protection delay that includes a time to measure the load current.

13. The method of claim 12, wherein the time is a delay time of a voltage comparator coupled between a voltage of a current sensor coupled with the IGBT and a short circuit reference voltage.

14. The method of claim 13, wherein the voltage of the current sensor is a voltage across a resistor coupled between a sense emitter and a Kelvin emitter of the IGBT.

* * * * *